United States Patent
Lee et al.

(10) Patent No.: US 9,247,614 B2
(45) Date of Patent: Jan. 26, 2016

(54) ORGANIC LIGHT-EMITTING DISPLAY DEVICE

(71) Applicant: SAMSUNG DISPLAY CO., LTD., Yongin-si, Gyeonggi-do (KR)

(72) Inventors: Min-Tak Lee, Yongin-si (KR); Young-Nam Yun, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 441 days.

(21) Appl. No.: 13/673,974

(22) Filed: Nov. 9, 2012

(65) Prior Publication Data

US 2014/0028181 A1 Jan. 30, 2014

(30) Foreign Application Priority Data

Jul. 27, 2012 (KR) .................. 10-2012-0082789

(51) Int. Cl.
*H01L 27/32* (2006.01)
*H05B 33/14* (2006.01)
*H01L 27/15* (2006.01)

(52) U.S. Cl.
CPC .............. *H05B 33/14* (2013.01); *H01L 27/322* (2013.01); *H01L 27/3211* (2013.01)

(58) Field of Classification Search
CPC ... H01L 27/322; H01L 33/50; H01L 27/3211; G02F 1/133617; G02F 1/133514; G02F 1/133621; H05B 33/14
USPC ................................................ 313/498–512
See application file for complete search history.

(56) References Cited

U.S. PATENT DOCUMENTS

| | | | |
|---|---|---|---|
| 2003/0020855 A1 | 1/2003 | Lee | |
| 2004/0195963 A1* | 10/2004 | Choi | .................. H01L 27/3213 313/504 |
| 2008/0252829 A1 | 10/2008 | Chae et al. | |
| 2012/0032583 A1* | 2/2012 | Kim | ...................... H01L 27/322 313/504 |

FOREIGN PATENT DOCUMENTS

| | | |
|---|---|---|
| JP | 2003-107239 A | 4/2003 |
| KR | 2002-0089622 | 11/2002 |
| KR | 10-2008-0093232 | 10/2008 |

* cited by examiner

*Primary Examiner* — Anh Mai
*Assistant Examiner* — Nathaniel Lee
(74) *Attorney, Agent, or Firm* — Christie, Parker & Hale, LLP

(57) ABSTRACT

An organic light-emitting display device including a first organic light-emitting device including a first pixel electrode, a first organic emission layer (EML) for emitting white light, and an opposite electrode; a first color filter between an insulating layer and the first pixel electrode, and transmitting blue light; a second organic light-emitting device including a second pixel electrode, the first organic EML for emitting white light, and the opposite electrode; a second color filter between the insulating layer and the second pixel electrode, and transmitting green light; a third organic light-emitting device including a third pixel electrode, a second organic EML for emitting a mixture light including a red color and a blue color, and the opposite electrode; and a third color filter between the insulating layer and the third pixel electrode, and including a first region for transmitting red light and a second region for transmitting the mixture light.

15 Claims, 7 Drawing Sheets

ORGANIC LIGHT-EMITTING DISPLAY DEVICE

CROSS-REFERENCE TO RELATED PATENT APPLICATION

This application claims priority to and the benefit of Korean Patent Application No. 10-2012-0082789, filed on Jul. 27, 2012, in the Korean Intellectual Property Office, the disclosure of which is incorporated herein in its entirety by reference.

BACKGROUND

1. Field

The present invention relates to an organic light-emitting display device having a color filter.

2. Description of the Related Art

Recently, display devices have been implemented as portable thin flat panel display devices. Among the flat panel display devices, organic or inorganic light-emitting display devices, which are self-emissive display devices having wide viewing angles, an excellent contrast ratio, and high response speeds, are regarded as next-generation display devices. The organic light-emitting display device, including an emission layer formed of an organic material, has excellent luminosity, driving voltage, and response speed characteristics compared to the inorganic light-emitting display devices, and may realize a color image.

In order to realize a color image, the organic light-emitting display device may emit a white color and then may separate the white color into three colors (e.g., primary colors) by passing the white color through a color filter. However, the traditional organic light-emitting display device may not convert the emitted light into a dominant wavelength of a particular color.

SUMMARY

Embodiments of the present invention provide an organic light-emitting display device that converts a wavelength of red light into a user-desired wavelength.

According to an aspect of the present invention, there is provided an organic light-emitting display device including: a substrate; a plurality of pixels on the substrate, each of the pixels including a first sub-pixel, a second sub-pixel, and a third sub-pixel for emitting different colors of light, respectively; an insulating layer on the substrate; a first organic light-emitting device on the insulating layer at the first sub-pixel, and sequentially including a first pixel electrode, a first organic emission layer (EML) for emitting white light, and an opposite electrode; a first color filter between the insulating layer and the first pixel electrode, and configured to transmit blue light; a second organic light-emitting device on the insulating layer at the second sub-pixel, and sequentially including a second pixel electrode, the first organic EML for emitting white light, and the opposite electrode; a second color filter between the insulating layer and the second pixel electrode, and configured to transmit green light; a third organic light-emitting device on the insulating layer at the third sub-pixel, and sequentially including a third pixel electrode, a second organic EML for emitting a mixture light including a red color and a blue color, and the opposite electrode; and a third color filter between the insulating layer and the third pixel electrode, which includes a first region for transmitting red light and a second region for transmitting the mixture light.

The second region may include a colorless color filter or a portion without a color filter.

The second region may be at a portion corresponding to a side of the third pixel electrode.

The second region may be at a portion corresponding to a center region of the third pixel electrode.

The first pixel electrode, the second pixel electrode, and the third pixel electrode may be transmissive electrodes.

The opposite electrode may be a reflective electrode.

According to an embodiment of the present invention, one or more thin film transistors (TFTs) are on the substrate, the insulating layer covers the one or more TFTs, and the one or more TFTs are in the first sub-pixel, the second sub-pixel, and the third sub-pixel, respectively, and are electrically connected to the first pixel electrode, the second pixel electrode, and the third pixel electrode, respectively.

According to another aspect of an embodiment according to the present invention, an organic light-emitting display device includes: a substrate; a plurality of pixels on the substrate, each of the pixels including a first sub-pixel, a second sub-pixel, and a third sub-pixel for emitting different colors of light; an insulating layer on the substrate; a first organic light-emitting device on the insulating layer at the first sub-pixel, and sequentially including a first pixel electrode, a first organic emission layer (EML) for emitting white light, and an opposite electrode; a first color filter configured to transmit blue light on the opposite electrode that corresponds to the first organic light-emitting device; a second organic light-emitting device on the insulating layer at the second sub-pixel, and sequentially including a second pixel electrode, the first organic EML for emitting white light, and the opposite electrode; a second color filter configured to transmit green light on the opposite electrode that corresponds to the second organic light-emitting device; a third organic light-emitting device on the insulating layer at the third sub-pixel, and sequentially including a third pixel electrode, a second organic EML for emitting a mixture light including a red color and a blue color, and the opposite electrode; and a third color filter on the opposite electrode that corresponds to the third organic light-emitting device, which includes a first region for transmitting red light and a second region for transmitting the mixture light.

The second region may include a colorless color filter or a portion without a color filter.

The second region may be at a portion corresponding to a side of the third pixel electrode.

The second region may be a portion corresponding to a center region of the third pixel electrode.

The first pixel electrode, the second pixel electrode, and the third pixel electrode may be reflective electrodes.

The opposite electrode may be a transmissive electrode.

The organic light-emitting display device may further include an adhesive layer between the opposite electrode and each of the first color filter, the second color filter, and the third color filter.

One or more thin film transistors (TFTs) may be on the substrate, the insulating layer may cover the one or more TFTs, and the one or more TFTs may be at the first sub-pixel, the second sub-pixel, and the third sub-pixel, respectively, and may be electrically connected to the first pixel electrode, the second pixel electrode, and the third pixel electrode, respectively.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Embodiments of the present invention are illustrated in the drawings and described in detail in the written description. However, the described embodiments are not intended to limit the present invention to particular modes of practice, and it is to be appreciated that all changes, equivalents, and substitutes that do not depart from the spirit and technical scope of the present invention are encompassed by the present invention. In the description of the present invention, certain detailed explanations of related art are omitted when it is deemed that they may unnecessarily obscure aspects of the invention. Additionally, when an element is referred to as being "on" another element, that element may be directly on the another element, or one or more intervening elements may be interposed therebetween.

As used herein, the term "and/or" includes any and all combinations of one or more of the associated listed items.

Figure 1:
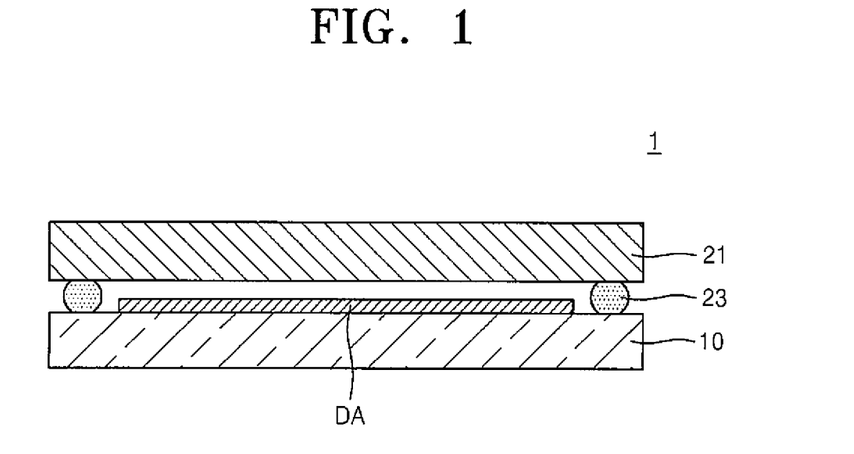
FIG. 1 is a cross-sectional view of an organic light-emitting display device according to an embodiment of the present invention.
Figure 2:
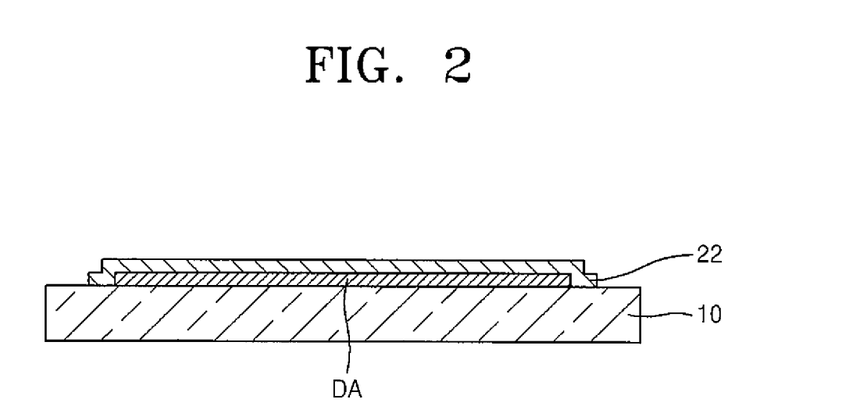
FIG. 2 is a cross-sectional view of the organic light-emitting display device according to another embodiment of the present invention.

FIG. 1 is a cross-sectional view of an organic light-emitting display device 1 according to an embodiment of the present invention. FIG. 2 is a cross-sectional view of the organic light-emitting display device 1 according to another embodiment of the present invention.

Referring to FIG. 1, the organic light-emitting display device 1 may include a first substrate 10, a display unit DA formed on the first substrate 10, and an encapsulation substrate 21 encapsulating the display unit DA.

The first substrate 10 may be a low-temperature polycrystalline silicon (LTPS) substrate, a glass substrate, a plastic substrate, or the like. The display unit DA may be arranged on the first substrate 10 and may include a plurality of emission pixels.

The encapsulation substrate 21 may be disposed above the first substrate 10 so as to block foreign moisture and air from penetrating the display unit IDA, which is arranged on the first substrate 10. The encapsulation substrate 21 may be positioned to face the first substrate 10. The encapsulation substrate 21 may be, for example, a glass substrate, a plastic substrate, or a Stainless Using Steel (SUS) substrate, and the first substrate 10 and the encapsulation substrate 21 may be bonded to each other by using a sealing member 23 that may be disposed along their sides.

However, aspects of the present invention are not limited thereto, and instead of the encapsulation substrate 21, as illustrated in FIG. 2, the display unit DA may be protected by forming a thin encapsulation film 22 on the first substrate 10. The thin encapsulation film 22 may have a structure in which an inorganic layer formed of, for example, silicon oxide or silicon nitride, and an organic layer formed of, for example, epoxy or polyimide, may be alternately stacked, but aspects of the present invention are not limited thereto. Also, although not illustrated, in order to encapsulate the display unit IDA, the encapsulation substrate 21 of FIG. 1 may be further formed on the thin encapsulation film 22 of FIG. 2 formed on the first substrate 10.

Figure 3:
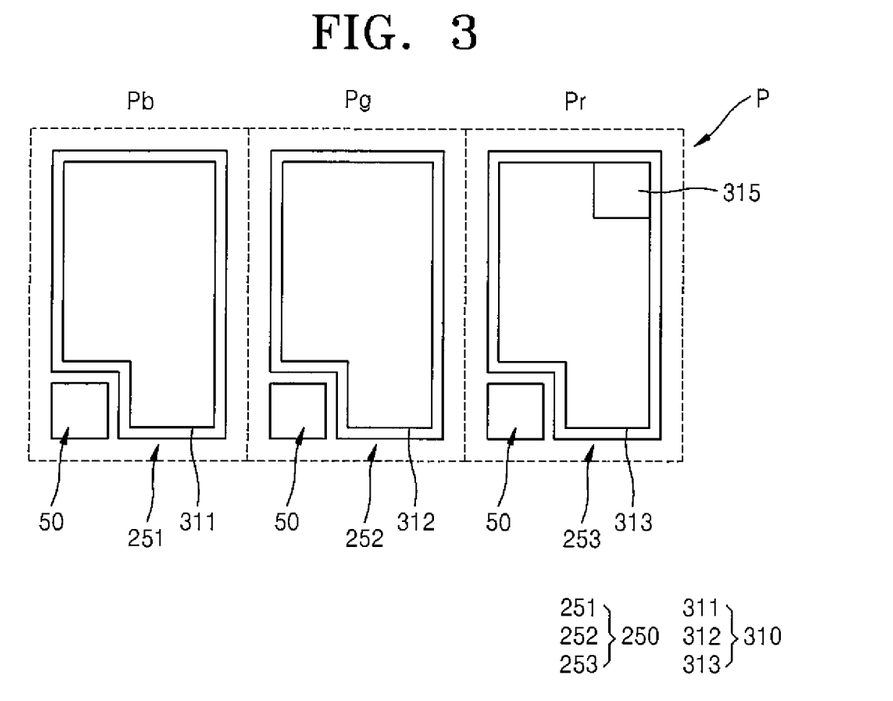
FIG. 3 is a plan view of a blue sub-pixel, a green sub-pixel, and a red sub-pixel, which are adjacent to each other and are included in a display unit of FIG. 1.
Figure 4:
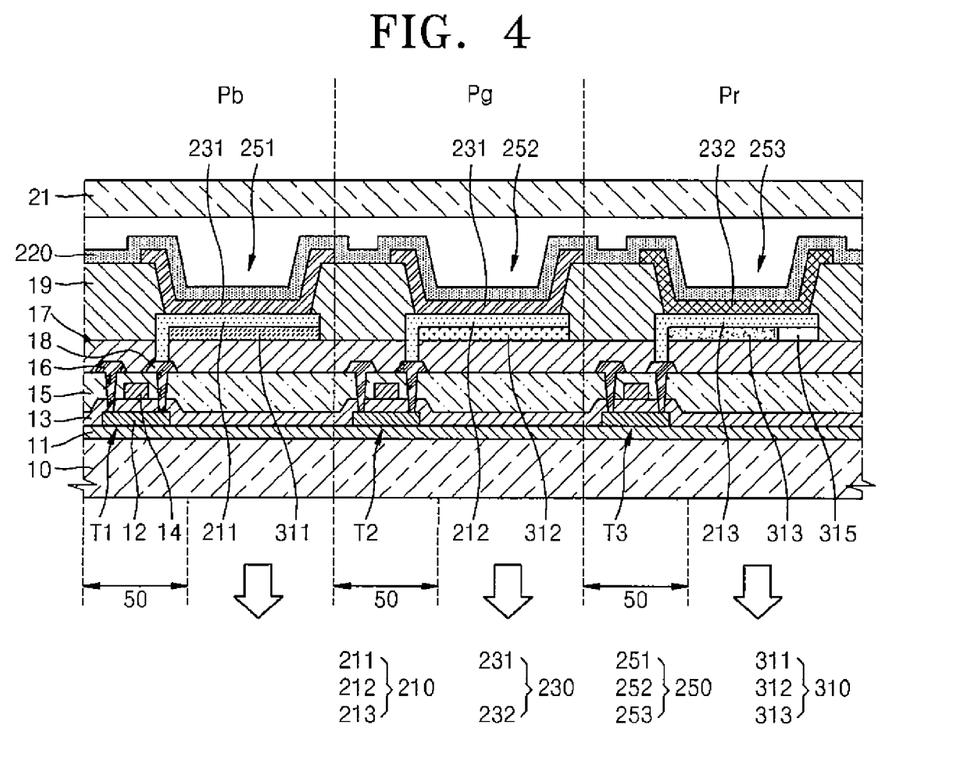
FIG. 4 is a cross-sectional view of the blue, green, and red sub-pixels of FIG. 3.

FIG. 3 is a plan view of a blue sub-pixel Pb, a green sub-pixel Pg, and a red sub-pixel Pr, which are adjacent to each other and are included in the display unit DA of FIG. 1. FIG. 4 is a cross-sectional view illustrating cross-sections of the blue, green, and red sub-pixels Pb, Pg, and Pr of FIG. 3.

In FIG. 3, one unit pixel P includes the blue sub-pixel Pb, the green sub-pixel Pg, and the red sub-pixel Pr. However, aspects of the present invention are not limited thereto, for example, the unit pixel P may further include a white sub-pixel (not shown). Also, an array, a structure, and an area of each of the blue sub-pixel Pb, the green sub-pixel Pg, and the red sub-pixel Pr are not limited to the example of FIG. 3 and, thus, may vary.

Each of the blue sub-pixel Pb, the green sub-pixel Pg, and the red sub-pixel Pr may include a circuit region 50 and an emission region.

Referring to FIG. 4, thin film transistors (TFTs) T1, T2, and T3 are arranged in the circuit regions 50 of the blue sub-pixel, Pb, the green sub-pixel Pg, and the red sub-pixel Pr, respectively. However, structures of the blue, green, and red sub-pixels Pb, Pg, and Pr are not limited to the arrangement of the circuit regions 50 including the TFTs T1, T2, and T3, respectively, as shown in FIG. 4; for example, each of the circuit regions 50 may further include a plurality of TFTs and storage capacitors.

Referring to FIG. 4, an organic light-emitting device 250 and a color filter 310 are arranged in each emission region. In more detail, a first organic light-emitting device 251 emitting a white color, and a blue color filter 311 overlap with each other in the emission region of the blue sub-pixel Pb. Also, a second organic light-emitting device 252 emitting a white color, and a green color filter 312 overlap with each other in the emission region of the green sub-pixel Pg. In addition, a third organic light-emitting device 253 emitting a purple color, and a red color filter 313 including a transparent portion 315 overlap with each other in the emission region of the red sub-pixel Pr. However, arrays, structures, and areas of the circuit regions 50 and the emission regions are not limited to the example of FIG. 3 and, thus, may vary.

Referring to FIG. 4, the first substrate 10 may be formed of a transparent glass material containing $SiO_2$ as a main component. If the organic light-emitting display device 1 is a bottom emission-type organic light-emitting display device in which an image is realized toward the first substrate 10, the first substrate 10 may be formed of a transparent material to transmit the emitted light.

A buffer layer 11 may be formed on a top surface of the first substrate 10 so as to planarize the first substrate 10 and to prevent penetration of foreign substances into the organic light emitting display device 1. The buffer layer 11 may be formed of $SiO_2$ and/or SiNx by using various methods including a plasma-enhanced chemical vapor deposition (PECVD) method, an atmospheric pressure CVD (APCVD) method, a low-pressure CVD (LPCVD) method, or the like.

The TFTs T1, T2, and T3 may be formed on the buffer layer 11. The TFTs T1, T2, and T3 may be formed in the blue sub-pixel Pb, the green sub-pixel Pg, and the red sub-pixel Pr, respectively, and may be electrically connected to the organic light-emitting devices 250, respectively, to drive the organic light-emitting devices 250.

A semiconductor layer 12 having a pattern (e.g., a suitable or predetermined pattern) may be formed on the buffer layer 11. The semiconductor layer 12 may be formed of an inorganic semiconductor such as amorphous silicon or polysilicon, or an organic semiconductor. However, aspects of the present invention are not limited thereto, and, for example, the semiconductor layer 12 may be formed of an oxide semiconductor. For example, the semiconductor layer 12 may be a G-I-Z-O layer [($In_2O_3$)a($Ga_2O_3$)b(ZnO)c layer] (where, a, b, and c are actual numbers that satisfy a≥0, b≥0, c>0, respectively). Although not illustrated in detail, the semiconductor layer 12 may include a source region, a drain region, and a channel region.

A gate insulating layer 13, which may be formed of $SiO_2$, SiNx, and the like, may be formed on the semiconductor layer 12, and a gate electrode 14 may be formed on a suitable (or predetermined) region of the gate insulating layer 13. The gate electrode 14 may be electrically connected to a gate line (not shown) that applies on/off signals of a TFT.

An interlayer insulating layer 15 may be formed on the gate electrode 14, and a source electrode 16, and a drain electrode 18 may be formed to contact source and drain regions of the semiconductor layer 12, respectively, via contact holes. Such formed TFTs T1, T2, and T3 may be protected by being covered with a passivation layer 17.

Although the TFTs T1, T2, and T3 of the present embodiment are described as top gate type TFTs, aspects of the present invention are not limited to the aforementioned forms or the number of TFTs, and, thus, various types of TFTs may also be used.

The passivation layer 17 may be formed as an inorganic insulating layer and/or an organic insulating layer. The inorganic insulating layer may include, for example, $SiO_2$, SiNx, SiON, $Al_2O_3$, $TiO_2$, $Ta_2O_5$, $HfO_2$, $ZrO_2$, barium strontium titanate (BST), or lead zirconate titanate (PZT), and the organic insulating layer may include polymer derivatives having commercial polymers (Polymethylmethacrylate (PMMA) and Polystylene(PS)) and a phenol group, an acryl-based polymer, an imide-based polymer, an allyl ether-based polymer, an amide-based polymer, a fluorine-based polymer, a p-xylene-based polymer, a vinyl alcohol-based polymer, or a combination thereof. The passivation layer 17 may be formed as a multi-stack including the inorganic insulating layer and the organic insulating layer.

The first, second, and third organic light-emitting devices 251, 252, and 253 may be formed on the passivation layer 17.

Referring to FIG. 4, because the first, second, and third organic light-emitting devices 251, 252, and 253 emit light toward the first substrate 10, the color filters 310 may be disposed between the passivation layer 17 and the first, second, and third organic light-emitting devices 251, 252, and 253. The color filter 310 may be a member capable of realizing a suitable (or predetermined) color by transmitting light having a specific wavelength (or specific wavelengths) and absorbing light having the remaining wavelengths.

In more detail, the blue color filter 311 transmitting a wavelength of a blue region (i.e., of a blue light spectrum) is disposed below the first organic light-emitting device 251. Thus, the blue color filter 311 transmits only light having a wavelength (or wavelengths) from the blue region of light from among the white light emitted from the first organic light-emitting device 251, and absorbs light having the remaining wavelengths, so that the blue sub-pixel Pb emits blue light. Also, the green color filter 312 transmitting a wavelength (or wavelengths) from a green region (i.e., of a green light spectrum) is disposed below the second organic light-emitting device 252. Thus, the green color filter 312 transmits only light having a wavelength (or wavelengths) from the green region of light from among the white light emitted from the second organic light-emitting device 252, and absorbs light having the remaining wavelengths, so that the green sub-pixel Pg emits green light. The red color filter 313 transmitting a wavelength from a red region of light (i.e., of a red light spectrum) is disposed below the third organic light-emitting device 253.

According to the present embodiment, the red color filter 313 includes a transparent portion 315. The transparent portion 315 may be a portion of a colorless color filter or a portion without a color filter. In the claims, the transparent portion 315 may also be referred to as a second region. Light emitted from the third organic light-emitting device 253 may pass through the transparent portion 315 without a change (e.g., the light may not be filtered). As will be described below, the third organic light-emitting device 253 may emit purple light, which is combination of red light and blue light. That is, a portion of the purple light from the third organic light-emitting device 253 may be emitted via the transparent portion 315 without a change, and the rest of the purple light may be filtered by the red color filter 313 so that only light having a red region wavelength is emitted. Thus, the red sub-pixel Pr may emit red light mixed with blue light, which means that red light of which a wavelength is converted may be realized.

The transparent portion 315 may be formed by first forming the red color filter 313 on the passivation layer 17 in the emission region of the red sub-pixel Pr, and then removing a portion of the red color filter 313 by, for example, performing a general photolithography process using a mask. Alternatively, the transparent portion 315 may be formed by additionally forming a colorless color filter on a removed portion of the red color filter 313.

Figure 5:
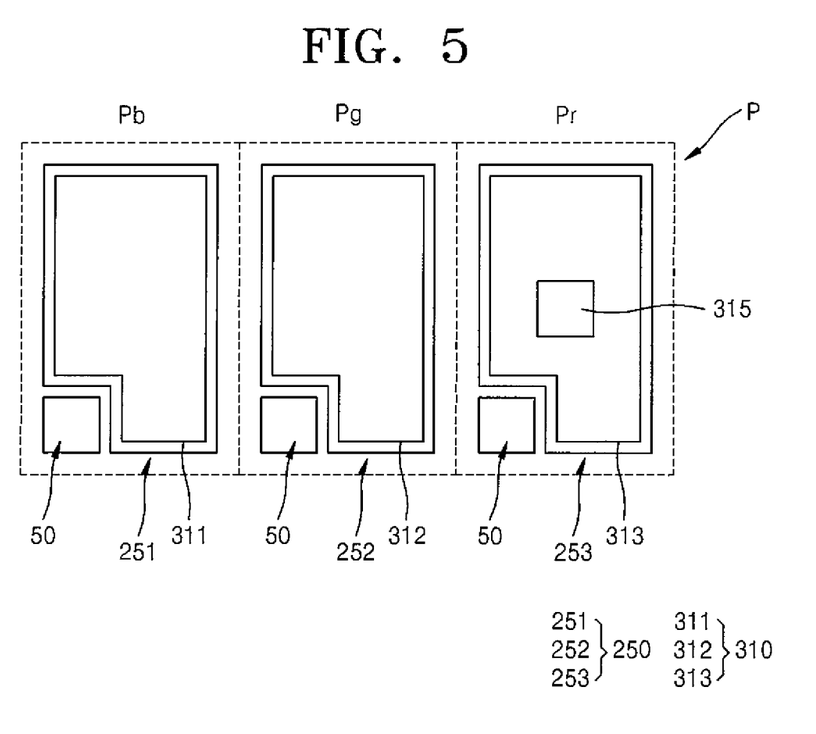
FIGS. 5 and 6 illustrate other examples of the embodiments shown in FIGS. 3 and 4.
Figure 6:
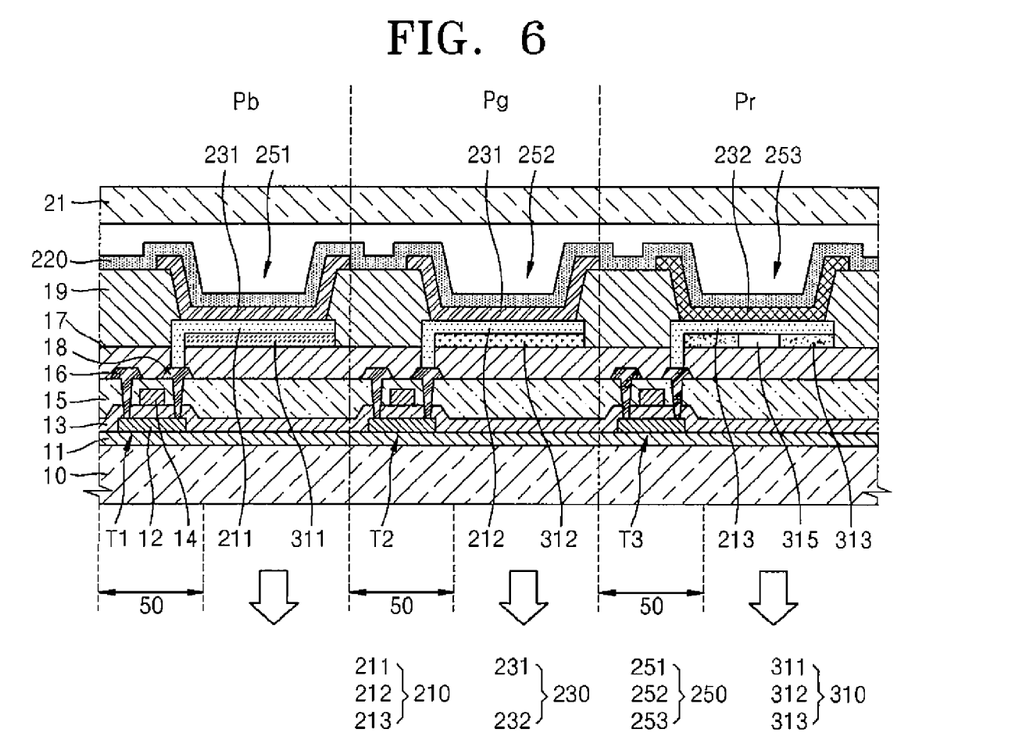

Referring to FIGS. 3 and 4, the transparent portion 315 may be formed at a side of the red color filter 313. However, aspects of the present invention are not limited thereto; for example, referring to FIGS. 5 and 6, the transparent portion 315 may be formed in a center region of the red color filter 313. If the transparent portion 315 is formed at the side, it may be easy to remove the portion for a mask design to be used in the photolithography process to form the transparent portion 315. However, when the transparent portion 315 is formed in the center region, mixed-color light through the transparent portion 315, and red light through the red color filter 313 may smoothly mix with each other, so that an image may be naturally realized. In this regard, a position, an array, and the like of the transparent portion 315 are not limited to the illustrated example and, thus, may vary.

According to an embodiment of the present invention, the transparent portion 315 may have an area that is from about 2% to about 5% of an area of the red color filter 313. If the area of the transparent portion 315 is less than about 2% of the area of the red color filter 313, a variation of a dominant wavelength of red light may be very small. If the area of the transparent portion 315 is greater than about 5% of the area of the red color filter 313, a color impression with respect to a red color may be decreased, such that color realization deteriorates.

After a color filter layer is formed on the passivation layer 17, the color filters 310 may be patterned to directly correspond to the first, second, and third organic light-emitting devices 251, 252, and 253, respectively, by performing a general photolithography process. However, aspects of the present invention are not limited thereto, and, for example, the color filters 310 may be patterned to correspond to the first, second, and third organic light-emitting devices 251, 252, and 253, respectively, by performing a laser-induced thermal imaging (LITI) method.

Each of the first, second, and third organic light-emitting devices 251, 252, and 253 includes a pixel electrode 210, an opposite electrode 220 facing the pixel electrode 210, and an organic emission layer (EML) 230 formed therebetween. The organic light-emitting display device 1 according to the present embodiment is described as a bottom emission-type organic light-emitting display device in which an image is realized toward the first substrate 10. As such, the pixel electrode 210 may be formed as a light-transmitting electrode, and the opposite electrode 220 may be formed as a reflective electrode. In addition, the first, second, and third organic light-emitting devices 251, 252, and 253 may include different types of organic EMLs 230, but may include the same type of pixel electrodes 210 and opposite electrodes 220. Thus, hereinafter, if required, first, second, and third pixel electrodes 211, 212, and 213, which are included in the first, second, and third organic light-emitting devices 251, 252, and 253, respectively, may be collectively referred to as a "pixel electrode 210".

The pixel electrode 210 may be formed as a transparent layer formed of ITO, IZO, ZnO, or $In_2O_3$ having a high work function. As illustrated, the pixel electrode 210 may be patterned to have an island form that corresponds to each sub-pixel. Also, the pixel electrode 210 may be electrically connected to an external terminal (not shown) and thus may function as an anode electrode.

A pixel defining layer (PDL) 19 that is an insulating layer may be formed on the pixel electrode 210 so as to cover the pixel electrode 210. After a suitable (or predetermined) opening is formed in the PDL 19, the organic EML 230 of the organic light-emitting device 250 may be formed in a region defined by the opening. Although not illustrated, as in the present embodiment, when the first organic light-emitting device 251 and the second organic light-emitting device 252 emit white light, a first organic EML 231 may not necessarily be formed in the region defined by the opening, and, thus, the first organic EML 231 may be formed (e.g., completely formed) on openings of the first and second pixel electrodes 211 and 212 and a top surface of the PDL 19.

The opposite electrode 220 may be formed as the reflective electrode by using Li, Ca, LiF/Ca, LiF/Al, Al, Mg, Ag, or the like having a low work function. The opposite electrode 220 may be formed on an entire emission region in which an image is realized. Also, the opposite electrode 220 may be electrically connected to an external terminal (not shown) and thus may function as a cathode electrode.

Polarities of the pixel electrode 210 and the opposite electrode 220 may be switched.

The organic EML 230 may be formed by using as a small molecule organic material or a polymer organic material. When the organic EML 230 is a small molecule organic layer formed of a small molecule organic material, a hole transport layer (HTL) and a hole injection layer (HIL) may be stacked below the organic EML 230 toward the pixel electrode 210, and an electron transport layer (ETL) and an electron injection layer (EIL) may be stacked on the organic EML 230 toward the opposite electrode 220. In addition to these layers, various layers including an HIL, an HTL, an ETL, an EIL or the like may be stacked on or below the organic EML 230 according to design considerations.

When the organic EML 230 is a polymer organic layer formed of a polymer organic material, a polymer HTL may be stacked on the organic EML 230 toward the pixel electrode 210. The polymer HTL may be formed of poly(3,4-ethylenedioxythiophene) (PEDOT) or polyaniline (PANI) and may be formed on the pixel electrode 210 by using an inkjet printing method or a spin coating method.

As described above, the first organic EML 231 included in each of the first and second organic light-emitting devices 251 and 252 may emit white light by electrically driving each of the first and second pixel electrodes 211 and 212 and the opposite electrode 220. Here, white light emitted from the first organic EML 231 may have an excellent Color Rendering Index (CRI) (e.g., >75) and may be close to coordinates of 0.33 and 0.33 in the International Commission on Illumination (CIE) diagram but is not limited thereto.

In order to emit white light from the first organic EML 231, various methods may be used. For example, a wave conversion method, which is a down conversion method in which phosphors are excited to emit a blue color or a purple color and then various colors emitted therefrom are mixed to form a wavelength spectrum having a large and colorful region, may be used. As another example, a color mixing method in which two basic colors (i.e., a blue color and an orange color) or three basic colors (i.e., a red color, a green color, and a blue color) are mixed to form white light may be used. However, aspects of the present invention are not limited to the above, and thus, various materials and methods capable of forming white light may also be used.

A second organic EML 232 included in the third organic light-emitting device 253 emits purple light.

In order to emit purple light from the second organic EML 232, a color mixing method may be used, and according to the color mixing method, two basic colors (i.e., a red color and a blue color) are mixed to form purple light. Here, when an amount of red light is greater than an amount of blue light, red-based purple light is formed, and when the amount of blue light is greater than the amount of red light, blue-based purple light is formed. Various materials and methods capable of forming purple light may be used according to embodiments of the present invention.

In order to prevent penetration of external moisture or oxygen, the encapsulation substrate 21 that encapsulates the organic light-emitting device 250 on the first substrate 10 may be arranged on the first, second, and third organic light-emitting devices 251, 252, and 253.

According to the present embodiment, the first and second organic light-emitting devices 251 and 252 that are included in the blue and green sub-pixels Pb and Pg, respectively, include the first organic EML 231 that emits white light. The blue color filter 311 is disposed to overlap with the first organic light-emitting device 251, so that blue light is externally emitted. Also, the green color filter 312 is disposed to overlap with the second organic light-emitting device 252, so that green light is externally emitted. The third organic light-emitting device 253 included in the red sub-pixel Pr includes the second organic EML 232 that emits a mixture light of a red color and a blue color. The red color filter 313, of which a portion may be transparent or may be removed, is disposed to overlap with the third organic light-emitting device 253. By doing so, mixture light in which red light is mixed with a portion of blue light is emitted from the red sub-pixel Pr.

According to aspects of the present invention, if a red color filter without a transparent portion were used, a dominant wavelength of light emitted from the red sub-pixel Pr may be from about 608 nm to about 612 nm. However, as in the present embodiment, if the red color filter 313 having the transparent portion 315 is used, a dominant wavelength of light emitted from the red sub-pixel Pr may extend to about 623 nm. That is, the light emitted from the red sub-pixel Pr is mixed with blue light to convert the dominant wavelength. In Europe, a dominant wavelength of a red color warning light used in dashboards of vehicles is recommended to be about 623 nm. Thus, a dominant wavelength of a red sub-pixel according to the related art may not satisfy the recommended standard. However, the organic light-emitting display device 1 that includes the third organic light-emitting device 253 emitting purple light, and the red color filter 313 including the transparent portion 315 may extend a dominant wavelength emitted from a red sub-pixel, as compared to the related art, and thus, may realize a red color having a dominant wavelength that satisfies the recommended standard.

Figure 7:
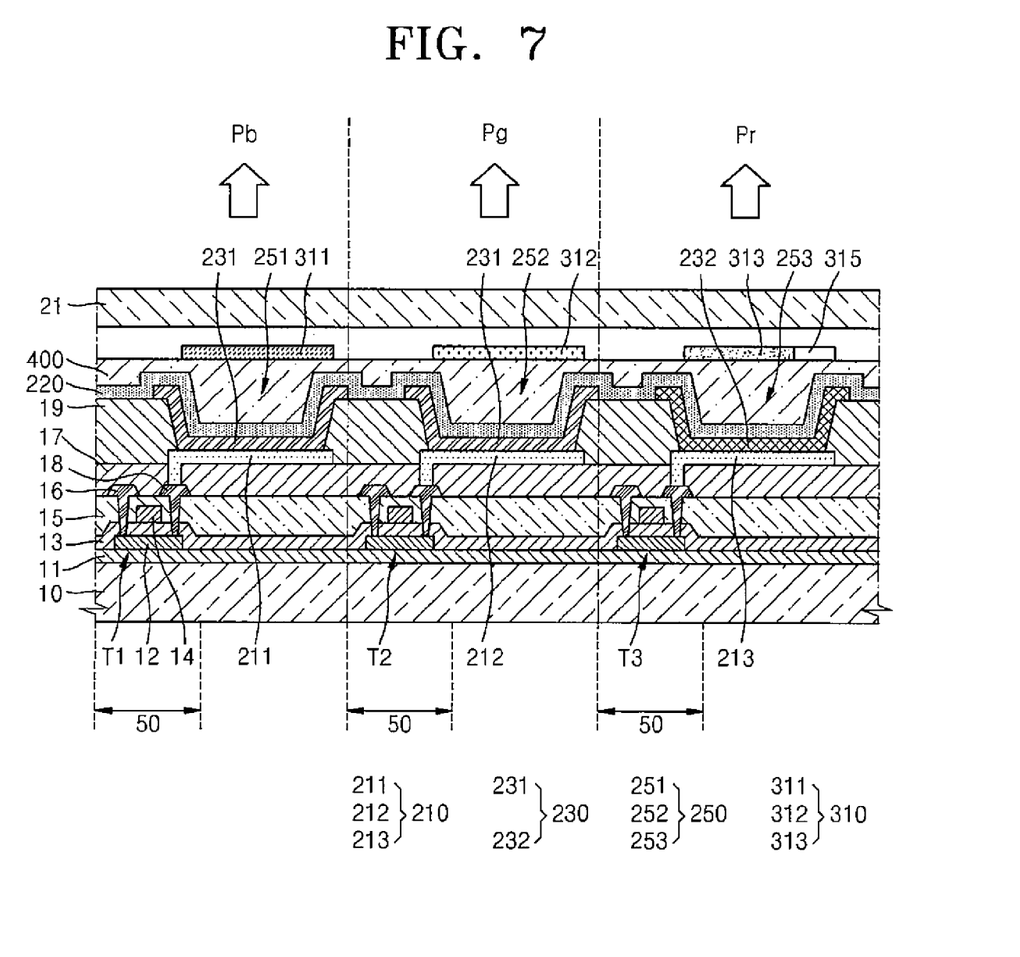
FIGS. 7 and 8 are cross-sectional views of an organic light-emitting display device that is a top emission type display device according to another embodiment of the present invention.
Figure 8:
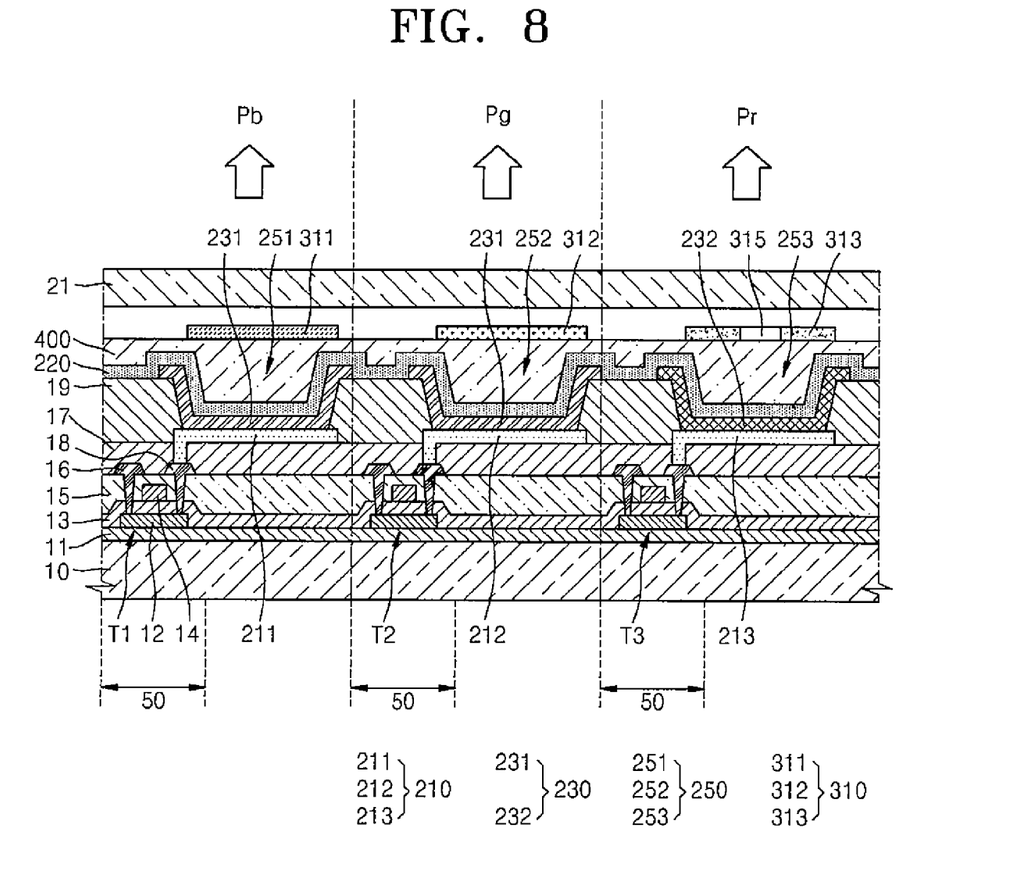

FIGS. 7 and 8 are cross-sectional views of an organic light-emitting display device 1 that is a top emission type display device according to another embodiment of the present invention. FIG. 7 corresponds to another example related to the embodiment shown in FIG. 4, and FIG. 8 corresponds to another example related to the embodiment shown in FIG. 6.

In the organic light-emitting display device 1 of FIGS. 7 and 8, an image is realized toward an encapsulation substrate 21. Accordingly, a color filter 310 may be formed above an opposite electrode 220, which is different from the embodiment of FIGS. 4 and 6. Here, like reference numerals of FIGS. 7 and 8 denote like elements of FIGS. 4 and 6. Because the like elements have the same (or similar) functions or the same (or similar) performances, descriptions of some aspects may be given by way of reference to the preceding embodiments.

Referring to FIG. 7, each of the TFTs T1, T2, and T3 is disposed in a circuit region 50, but while one TFT is shown in the circuit region 50 of FIG. 7, the circuit region 50 may further include a plurality of TFTs and storage capacitors.

Referring to FIG. 7, an organic light-emitting device 250 and the color filter 310 are disposed in an emission region. Here, because first, second, and third organic light-emitting devices 251, 252, and 253 emit light toward the encapsulation substrate 21, the color filter 310 is disposed above the opposite electrode 220 so as to correspond to the organic light-emitting device 250. In more detail, a blue color filter 311 may be disposed above a portion of the opposite electrode 220 of the first organic light-emitting device 251, and a green color filter 312 may be disposed above a portion of the opposite electrode 220 of the second organic light-emitting device 252. A red color filter 313, including a transparent portion 315, may be disposed above a portion of the opposite electrode 220 of the third organic light-emitting device 253. In FIG. 7, the transparent portion 315 is shown at a side of the red color filter 313; however, aspects of the present invention are not limited thereto, and for example, as illustrated in FIG. 8, the transparent portion 315 may be formed in a center region of the red color filter 313.

If the transparent portion 315 is formed at the side of the red color filter 313, it may be easy to remove the portion for a mask design to be used in a photolithography process to form the transparent portion 315. If the transparent portion 315 is formed in the center region of the red color filter 313, mixed-color light through the transparent portion 315, and red light through the red color filter 313 may smoothly mix with each other, so that an image may be naturally realized. In this regard, a position, an array, and the like of the transparent portion 315 are not limited to the illustrated example and, thus, may vary.

The color filter 310 may be adhered to the opposite electrode 220 via an adhesive layer 400. The adhesive layer 400 may be arranged on the opposite electrode 220, thereby planarizing a surface of the opposite electrode 220 and adhering the color filter 310 to the opposite electrode 220. The adhesive layer 400 may be formed of an adhesive material including an organic material or an inorganic material.

As illustrated in FIGS. 7 and 8, a pixel electrode 210 of the organic light-emitting display device 1 may include a reflective layer formed of Ag, Mg, Al, Pt, Pd, Au, Ni, Nd, Ir, Cr or compound of any of these, and a transparent layer formed of ITO, IZO, ZnO or $In_2O_3$ which has a high work function.

The opposite electrode 220 may be formed as a transmissive electrode and may be a transflective layer formed of a thin metal material including Li, Ca, LiF/Ca, LiF/Al, Al, Mg, or Ag which has a low work function. A high resistance due to a thickness of the transflective layer formed of the thin metal material may be complemented by forming a transparent conductive layer including ITO, IZO, ZnO or $In_2O_3$ on the transflective layer.

Similar to the previous embodiments, according to the present embodiment of FIGS. 7 and 8, the first and second organic light-emitting devices 251 and 252 that are included in blue and green sub-pixels Pb and Pg, respectively, include a first organic EML 231 that emits white light. The blue color filter 311 may be disposed to overlap with the first organic light-emitting device 251, so that blue light is externally emitted. Also, the green color filter 312 may be disposed to overlap with the second organic light-emitting device 252, so that green light is externally emitted. The third organic light-emitting device 253 included in a red sub-pixel Pr includes a second organic EML 232 that emits mixture light of a red color and a blue color. Then, the red color filter 313, of which a portion may be transparent or may be removed, may be disposed to overlap with the third organic light-emitting device 253. By doing so, a mixture light, in which red light is mixed with a portion of blue light, is emitted from the red sub-pixel Pr.

As described above, an area of the transparent portion 315 may be from about 2% to about 5% of an area of the red color filter 313. According an aspect of an embodiment of the present invention, when the area of the transparent portion 315 is less than about 2% of the area of the red color filter 313, a variation of a dominant wavelength of red light may be very small. However, when the area of the transparent portion 315 is greater than about 5% of the area of the red color filter 313, a color impression with respect to a red color may be decreased, such that color realization deteriorates.

Thus, according to one or more embodiments of the present invention, an organic light-emitting display device includes an organic EML emitting purple light, and a red color filter including a transparent portion, so that the organic light-emitting display device may extend a dominant wavelength emitted from a red sub-pixel, compared to the related art.

Also, according to one or more embodiments of the present invention, a color filter may be formed above a pixel electrode or an opposite electrode of an organic light-emitting device, so that light with a brighter color may be emitted, compared to a case in which a color filter is formed on a first substrate or an encapsulation substrate.

As yet another embodiment according to the present invention, a third organic light-emitting device may emit white light, and a blue portion, instead of the transparent portion, may be inserted into the red color filter. The blue portion may be arranged by replacing a portion of the red color filter with a blue color filter, and indicates a portion that transmits only blue light and absorbs the rest of the colors of light. In this case, white light emitted from the third organic light-emitting device is emitted as red light via the red color filter and is emitted as blue light via the blue portion, so that mixture light, in which red light is mixed with a portion of blue light, may be finally emitted. Accordingly, a dominant wavelength of red light emitted from the red sub-pixel may be adjusted by the blue portion.

In the embodiments of FIGS. 4,6,7, and 8, an organic light-emitting device is formed on a passivation layer. However, aspects of the present invention are not limited thereto, and one or more embodiments of the present invention may also be applied to an example in which the organic light-emitting device is formed on a gate insulating layer or an interlayer insulating layer via reduction of a lithography process.

Also, one or more embodiments of the present invention may also be applied to a dual emission type organic light-emitting display device in which both a pixel electrode and an opposite electrode are formed as transmissive electrodes. In this case, a color filter may be disposed below the pixel electrode and on the opposite electrode.

According to one or more embodiments of the present invention, a wavelength of red light may be converted into a suitable (e.g., a user-desired) wavelength and then output by using a red color filter including a transparent portion and an organic EML that emits purple light. Thus, an organic light-emitting display device may emit red light having the user-desired wavelength.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. An organic light-emitting display device comprising:
a substrate;
a plurality of pixels on the substrate, each of the pixels comprising a first sub-pixel, a second sub-pixel, and a third sub-pixel for emitting different colors of light, respectively;
an insulating layer on the substrate;
a first organic light-emitting device on the insulating layer at the first sub-pixel, and sequentially comprising a first pixel electrode, a first organic emission layer (EML) for emitting white light, and an opposite electrode;
a first color filter between the insulating layer and the first pixel electrode, and configured to transmit blue light;
a second organic light-emitting device on the insulating layer at the second sub-pixel, and sequentially comprising a second pixel electrode, the first organic EML for emitting white light, and the opposite electrode;
a second color filter between the insulating layer and the second pixel electrode, and configured to transmit green light;
a third organic light-emitting device on the insulating layer at the third sub-pixel, and sequentially comprising a third pixel electrode, a second organic EML for emitting a purple light comprising a red color and a blue color, and the opposite electrode; and
a third color filter between the insulating layer and the third pixel electrode, and comprising a first region for transmitting red light and a second region for transmitting the purple light,
wherein the transmitted purple light combines with the transmitted red light and the combined light has a dominant wavelength different from that of the transmitted red light alone.

2. The organic light-emitting display device of claim 1, wherein the second region comprises a colorless color filter or a portion without a color filter.

3. The organic light-emitting display device of claim 1, wherein the second region is at a portion corresponding to a side of the third pixel electrode.

4. The organic light-emitting display device of claim 1, wherein the second region is at a portion corresponding to a center region of the third pixel electrode.

5. The organic light-emitting display device of claim 1, wherein the first pixel electrode, the second pixel electrode, and the third pixel electrode comprise transmissive electrodes.

6. The organic light-emitting display device of claim 1, wherein the opposite electrode comprises a reflective electrode.

7. The organic light-emitting display device of claim 1,
wherein one or more thin film transistors (TFTs) are on the substrate,
wherein the insulating layer covers the one or more TFTs, and
wherein the one or more TFTs are in the first sub-pixel, the second sub-pixel, and the third sub-pixel, respectively, and are electrically connected to the first pixel electrode, the second pixel electrode, and the third pixel electrode, respectively.

8. An organic light-emitting display device comprising:
a substrate;
a plurality of pixels on the substrate, each of the pixels comprising a first sub-pixel, a second sub-pixel, and a third sub-pixel for emitting different colors of light;
an insulating layer on the substrate;
a first organic light-emitting device on the insulating layer at the first sub-pixel, and sequentially comprising a first pixel electrode, a first organic emission layer (EML) for emitting white light, and an opposite electrode;
a first color filter configured to transmit blue light on the opposite electrode that corresponds to the first organic light-emitting device;
a second organic light-emitting device on the insulating layer at the second sub-pixel, and sequentially comprising a second pixel electrode, the first organic EML for emitting white light, and the opposite electrode;
a second color filter configured to transmit green light on the opposite electrode that corresponds to the second organic light-emitting device;
a third organic light-emitting device on the insulating layer at the third sub-pixel, and sequentially comprising a third pixel electrode, a second organic EML for emitting a purple light comprising a red color and a blue color, and the opposite electrode; and
a third color filter on the opposite electrode that corresponds to the third organic light-emitting device, and comprising a first region for transmitting red light and a second region for transmitting the purple light,
wherein the transmitted purple light combines with the transmitted red light and the combined light has a dominant wavelength different from that of the transmitted red light alone.

9. The organic light-emitting display device of claim 8, wherein the second region comprises a colorless color filter or a portion without a color filter.

10. The organic light-emitting display device of claim 8, wherein the second region is at a portion corresponding to a side of the third pixel electrode.

11. The organic light-emitting display device of claim 8, wherein the second region is at a portion corresponding to a center region of the third pixel electrode.

12. The organic light-emitting display device of claim 8, wherein the first pixel electrode, the second pixel electrode, and the third pixel electrode comprise reflective electrodes.

13. The organic light-emitting display device of claim 8, wherein the opposite electrode comprises a transmissive electrode.

14. The organic light-emitting display device of claim 8, further comprising an adhesive layer between the opposite electrode and each of the first color filter, the second color filter, and the third color filter.

15. The organic light-emitting display device of claim 8,
wherein one or more thin film transistors (TFTs) are on the substrate,
wherein the insulating layer covers the one or more TFTs, and
wherein the one or more TFTs are at the first sub-pixel, the second sub-pixel, and the third sub-pixel, respectively, and are electrically connected to the first pixel electrode, the second pixel electrode, and the third pixel electrode, respectively.

* * * * *